(12) United States Patent
Fenney

(10) Patent No.: US 7,796,065 B2
(45) Date of Patent: Sep. 14, 2010

(54) METHOD OF DECODING DATA AND APPARATUS THEREFOR

(75) Inventor: Simon Fenney, Herts (GB)

(73) Assignee: Imagination Technologies Limited, Herts (GB)

( * ) Notice: Subject to any disclaimer, the term of this patent is extended or adjusted under 35 U.S.C. 154(b) by 0 days.

(21) Appl. No.: 12/086,217

(22) PCT Filed: Dec. 7, 2006

(86) PCT No.: PCT/GB2006/004583

§ 371 (c)(1),
(2), (4) Date: Oct. 3, 2008

(87) PCT Pub. No.: WO2007/066121

PCT Pub. Date: Jun. 14, 2007

(65) Prior Publication Data

US 2009/0278715 A1    Nov. 12, 2009

(30) Foreign Application Priority Data

Dec. 7, 2005    (GB) .................................. 0524983.4

(51) Int. Cl.
*H03M 7/00* (2006.01)
(52) U.S. Cl. ......................... 341/107; 341/51; 382/247

(58) Field of Classification Search .................. 341/107; 382/247
See application file for complete search history.

(56) References Cited

U.S. PATENT DOCUMENTS

| 6,917,310 B2 * | 7/2005 | Pearson et al. ................. 341/50 |
| 6,927,710 B2 * | 8/2005 | Linzer et al. ................. 341/107 |
| 7,061,410 B1 | 6/2006 | Pearson et al. |
| 2004/0085233 A1 | 5/2004 | Linzer et al. |

FOREIGN PATENT DOCUMENTS

| EP | 1 365 591 A3 | 11/2003 |
| EP | 1 545 133 A2 | 6/2005 |

* cited by examiner

*Primary Examiner*—Khai M Nguyen
(74) *Attorney, Agent, or Firm*—Flynn, Thiel, Boutell & Tanis, P.C.

(57) ABSTRACT

Incoming decoded data (1), for example from an H264 decoder, is fed to an encoder unit (2) that entropy encodes the decoded data using a parallel encoding scheme that includes context-based arithmetic encoding. The syntax is chosen so that the context does not depend on the immediately previously encoded symbol. The output of the encoder (2) is fed to a FIFO memory whose output is fed to a complimentary decoder (4) whose output produces a delayed copy of the incoming decoded data (1).

14 Claims, 9 Drawing Sheets

METHOD OF DECODING DATA AND APPARATUS THEREFOR

FIELD OF THE INVENTION

This invention relates to the processing of entropy encoded data streams, in particular to a method of and apparatus for decoding such data streams.

BACKGROUND OF THE INVENTION

Examples of entropy encoded data streams are compressed video data streams including that of the new "H264" video encoding standard ("ITU-T Recommendation H.264: Advanced video coding for generic audiovisual services"). Wiegend et al provide a somewhat shorter summary of this specification in "An Overview of the H.264/AVC Video Coding Standard" (IEEE Trans. On Circuits and Systems for Video Technology July 2003).

Most video compression schemes include some form of entropy encoding whereby 'raw' data symbols are replaced by a representation that reflects their probability of occurrence so that frequently occurring symbols are encoded with a representation with fewer bits, whilst infrequent symbols are encoded with longer representations. Shannon's theory states that the optimal number of bits for a symbol with probability, p, is $-\log(p)/\log(2)$. For example, a symbol with a 1 in 3 chance of occurring is optimally represented by 1.585 bits.

Many of the encoding schemes use Variable Length Coding (VLC) systems, similar to that of Huffman's, to do entropy encoding. Such schemes are generally very easy to encode and decode, however, as each code is always an integer number of bits in length, it generally fails to achieve to the optimum described by Shannon.

More recent alternatives to VLC schemes include Arithmetic Encoding (an introduction to which can be found in "Numerical Recipes in C", Press et al ISBN 0-521-43108-5), and the virtually equivalent Range Encoding. Both of these encoding schemes are more advanced entropy encoding schemes which do get very close to Shannon's optimum by, in effect, allowing symbols to be represented with fractional numbers of bits. One drawback, however, is that they are much more complex to encode and decode than a VLC approach.

The new H264 standard, in particular its CABAC mode, (see "Context-based adaptive binary arithmetic coding in the H.264/AVC video compression standard" Marpe et al. IEEE Transactions on Circuits and Systems for Video Technology, July 2003), uses a form of arithmetic encoding. The H264 CABAC scheme makes the process even more challenging by . . .

a) Using the arithmetic encoder/decoder to encode only two symbols, i.e. either 0 or 1, rather than sets of values. It should be noted, however, that an arithmetic decoder that can decode from a choice of more than two symbols is also more expensive to construct. Typically, an encoder or decoder that directly handles N symbols will have a cost of O(N), whereas processing N symbols using a two symbol decoder (over multiple steps) will cost O(log(N)).

b) Updating the statistics (known in H264 as the context) used to perform the encoding/decoding after every encoded/decoded bit.

c) Maintaining numerous contexts which can be selected on a bit by bit basis.

d) Assembling the decoded arithmetic bits into symbols by using a "debinarisation" process which can include several steps.

In the case of the Inverse Discrete Cosine Transform (IDCT) parameters, this includes decoding a significance map, decoding sign bits for the non zero symbols, decoding unary string data for non-zero symbols, and decoding exponential Golomb data for the large non zero symbols. Each of these decoding steps selects the different contexts which are fed back to control the arithmetic decoder.

By following these steps a very high compression ratio can be achieved. There is, however, a cost penalty. It makes it very difficult, if not impossible, for hardware to decode more than one bit per clock (for a clock rate, say, in the range of 100~200 Mhz). Although some progress has been made in parallelising arithmetic encoding (assuming the context remains constant) none appears to have been made for the decoding (see "Arithmetic Encoding in Parallel", Supol and Melichar). If each frame consisted of multiple 'slices' (i.e. portions of a frame), then it would be possible to decode each slice in parallel, but as there is no guarantee that the incoming video stream will have more than one slice per frame this is not a suitable approach.

Furthermore, as stated in d) above, source symbols in the video stream generally consist of multiple bits (for example the source values may be signed 16-bit values) and so CABAC also employs VLC encoding schemes, such as unary and Golomb coding. When encoding the video data, the system must first convert each raw symbol value to the VLC binary encoded version (known in H264 as 'binarisation'), which in turn is then compressed by the binary arithmetic encoder. The decoder essentially runs these steps in reverse to obtain the original data stream. This means that, in the worst case, even if the arithmetic decoder can decode one bit per clock, it may take many clock cycles to obtain the final symbol. For example, when processing the IDCT data, it takes of the order of 30 cycles to decode a symbol value of "64" using the CABAC process, assuming an arithmetic decode rate of one bit per clock, whilst a simple "+1" value would take four clocks to decode with CABAC. The decode costs associated with the larger values are offset by their very low probability and by the very high probability of zero values, which are decoded at much faster rates. Some examples of the number of bits needed to encode values for the IDCT coefficients (including the significance map), using the binarisation process, are given in the following table:

| Symbol Value | Number of bits in "Binarised" representation |
|---|---|
| 0 | 1 (or 0 when implied by the significance map) |
| +/−1 | 4 |
| +/−2 | 5 |
| +/−5 | 8 |
| +/−10 | 13 |
| +/−20 | 23 |
| +/−50 | 29 |
| +/−100 | 31 |
| +/−200 | 33 |
| +/−500 | 35 |
| +/−1000 | 37 |
| +/−2000 | 39 |
| +/−5000 | 43 |
| +/−10000 | 45 |
| +/−20000 | 47 |

-continued

| Symbol Value | Number of bits in "Binarised" representation |
|---|---|
| +/−50000 | 49 |
| +/−65535 | 49 |

The decode timing is further complicated, as mentioned in d), by the fact that the context data that is used to control the arithmetic decoder, is frequently chosen on a bit-by-bit basis, dependent on the value of previously decoded bit. This means that if it is necessary to decode one bit per clock, then either the arithmetic decoding of a bit and the de-binarisation decision step based on the value of that bit must run in the same clock period or some kind of speculative, parallel decoder must be constructed. The first may not be possible to achieve with today's technologies and the second is costly to implement. Therefore, it is likely that an H264 arithmetic decoder hardware solution running at 100~200 MHz will not achieve one bit per clock which further compounds the timing problems.

Although a compressed video stream will have a well specified average data rate, for example 50 Mbit/s for a high definition video (i.e. 1920×1080 pixels @ 30 fps), the instantaneous rate of data in that video stream can vary enormously from frame to frame. Some frames, known as Intra-encoded (or I-frames), generally have a large proportion of the data whilst Predicted-frames (P-frames) and Bidirectional-frames (B-frames) require far fewer bits as they borrow data from previously decoded frames. For example, in a given sample video stream encoded at 40 Mbit/s, each I-frame typically required around 3 Mbits, with P- and B-frames being around one half and one third that size respectively. It is not difficult to produce a hardware CABAC decoder (say, running at 100~200 MHz) that can decode a video stream that uses the maximum rate of 50 Mb/s, but a conventional decoder will not produce that data at a steady per-frame rate.

If the processing costs of each video frame purely depended on the amount of entropy encoded data, then there would be no problem to solve. There are, however, parts of the processing which are more fixed in their processing rate. For example, the IDCT calculation, motion compensation, and de-ringing/de-blocking units will generally take time that depends on the number of pixels processed. Since these units are more constant in their processing times, we have a situation where, in effect, there is a relatively fixed-rate consumer process, i.e. the back-end video processor, being fed by a highly variable source producer, the entropy decoder.

For example, a hardware solution might perform the IDCT processing for an H264 macro-block consisting of 384 pixels, in ~400 clock cycles. The parameters for this data, as supplied by the entropy decoder, may have anywhere from 0 to 384 symbols depending on the complexity of the image in the macro-block region, and consequently take anywhere from zero to many thousands of clock cycles to be entropy decoded.

This leads to situations when, very frequently, one unit is stalled by the other due to the mismatch of processing rates. This, in turn, results in the overall processing rate, in terms of frames per second, dropping to the instantaneous minimum of the two, which could mean the system would fail to meet the required decoding frame rate. Looking again at the IDCT example above, if the entropy encoder could decode each symbol at the rate of one symbol per clock, there would be no problem.

As stated, it is impractical (if not impossible) to make the entropy decoder run faster, and making the consumer units run faster may be exceedingly expensive. The obvious and time-honoured tradition in these situations is to introduce a rate-smoothing FIFO between producer and consumer. This common practice is widely used in devices ranging from 3D graphics processing chips to hard-disk controllers.

Although a simple FIFO will 'solve' the problem, there is the inconvenience that it may need to contain many frames' worth of data in order to effectively smooth the data rate. This would typically force the buffer to be in external memory which implies not only that it ties up a large amount of RAM but also that it consumes considerable bandwidth for writing and reading of the buffer. Earlier video standards have used Huffman/VLC encoding, which can easily be encoded and decoded at a symbol-per-clock rate, and so a fairly obvious choice is to use such an encoding scheme to recompress the data on input to the FIFO and then decompress the compressed data again on exit. In fact, in a video encoding/decoding chip that handles multiple standards, such VLC hardware will exist anyway. This rather straightforward approach appears to have also been described by Linzer and Leung (U.S. Pat. No. 6,927,710).

A related scheme is described by Schumann (US patent application 20040260739). In this method, rather than immediately 'debinarising' the data, the 'binarised' bits that are output from the CABAC's arithmetic decoder are fed into the FIFO and then a (second) de-binarisation unit is placed at the other end of the FIFO. (Note that a partial de-binarisation unit is still needed adjacent to the arithmetic decoder unit in order to select the correct contexts). The binarised data (i.e. the data still encoded in, for example, significance map+unary+Golomb form) is still a reasonably well compressed format. Unfortunately, a likely problem with this method is that it may require a very large window of bits and complicated hardware in order to allow each symbol to be decompressed in a single clock cycle. This can be seen from the IDCT binarisation cost table given previously.

Finally, also of interest is an examination of the typical values that are decoded from the CABAC unit in an H264 video stream. Of particular interest are the IDCT coefficients since these typically make up the vast bulk of the decoded data. The following table gives the values and probabilities of IDCT values as sampled from a typical H264, high definition, video stream. Listed alongside the probabilities are the optimum storage costs.

| Residual Value | Probability (%) | optimum # bits |
|---|---|---|
| 0 | 72.87% | 0.46 |
| +1 | 9.26% | 3.43 |
| −1 | 9.56% | 3.39 |
| +2 | 2.04% | 5.61 |
| −2 | 2.14% | 5.55 |
| +3 | 0.87% | 6.85 |
| −3 | 0.90% | 6.79 |
| Others | <0.5% | >7.7 |

With each block of IDCT values, many of the higher frequency terms are very likely to be zero. If the contiguous high frequency zeros are removed (by some, yet unspecified, means), the table becomes:

| Residual Value | Probability (%) + optimum # bits | |
| --- | --- | --- |
| 0 | 51.88% | 0.95 |
| +1 | 16.42% | 2.61 |
| −1 | 16.96% | 2.56 |
| +2 | 3.62% | 4.79 |
| −2 | 3.79% | 4.72 |
| +3 | 1.54% | 6.02 |
| −3 | 1.60% | 5.96 |
| others | <0.8% | |

If the remaining zeros can be implied by some means (for example, via the use of Run-Level or perhaps significance map encoding), then the probabilities of non-zero values then becomes:

| Residual Value | Probability (%) + optimum # bits | |
| --- | --- | --- |
| +1 | 34.12% | 1.6 |
| −1 | 35.25% | 1.5 |
| +2 | 7.53% | 3.7 |
| −2 | 7.88% | 3.7 |
| +3 | 3.20% | 5.0 |
| −3 | 3.33% | 4.9 |

If these very common values are encoded using a simple VLC entropy scheme, such as Huffman which must use an integer number of bits to represent each symbol, then it should be apparent that it will be far from optimal since the best fit for the very common +/−1 values will be two bits, representing approximately a 25% increase in storage costs relative to the ideal.

As stated, arithmetic encoding is superior to that of the VLC/Huffman approaches in that it can represent symbols with fractional numbers of bits, leading to potentially greater levels of compression. The problem is that it an adaptive scheme can be rather sequential to decode and thus makes it difficult to achieve a peak rate of one entire (multi-bit)symbol per clock.

A rate smoothing FIFO can be introduced between the producer and consumer of the decoded data but, if that is represented in a naïve form, it can require a very large FIFO. A compression scheme can be applied to the data going in to the FIFO that will reduce the size required for the FIFO but it is desirable to increase the efficiency of the known compression schemes to further reduce the required size of the FIFO.

SUMMARY OF THE INVENTION

In a first aspect the invention provides a method of decoding context-based adaptive arithmetic entropy coded data comprising the steps of;
a) decoding the encoded data to produce first decoded data,
b) entropy encoding the decoded data using a parallel encoding scheme that includes context-based adaptive arithmetic encoding for at least portions of the symbols to produce second encoded data,
c) storing the second encoded data in a first in first out (FIFO) memory,
d) reading the second encoded data from the FIFO memory, and
e) decoding the data read from the FIFO memory to produce second decoded data, the second decoded data being the decoded entropy coded data.

In step b) the encoder may encode an N-bit symbol, wherein the symbol is divided into multiple streams and at least two of the streams are encoded in parallel using a corresponding number of arithmetic encoding units.

The invention enables:
a) the maximum encoded sizes to be kept small,
b) a higher compression ratio than VLC methods to be achieved by using arithmetic encoding, and
c) under most circumstances a decode/encode rate of one (multi-bit) symbol per clock to be achieved.

This application describes a means of compressing and decompressing the FIFO data using arithmetic encoding and decoding that virtually guarantees a rate of one symbol per clock whilst still achieving a respectable compression ratio. It does this through parallelising at least parts of the encode/decode process and in some embodiments by improving the pipelining of the system by decoupling the context selection for a symbol from the previously decoded symbol. In addition, a 'language syntax' may be applied on top of the re-encoder-decoder to allow it to be used by multiple parts of the H264 video stream as well as by other video standards—even those employing simpler VLC codes—which can subsequently ease the timing constraints for those decoding units.

In the context of this description and the appended claims the term 'arithmetic coding' (apart from where specific details of particular embodiments are concerned) should be interpreted to include range coding.

The encoder may accept a 'symbol', where a symbol is an N-bit numeric value, and encodes this in a single clock (except in very rare circumstances). As part of this process, the symbol is broken into multiple streams wherein at least two of these streams are compressed, in parallel, with either multiple arithmetic encoding units or a combination of arithmetic and VLC encoding. In other embodiments, range encoding may be used in place of arithmetic encoding since they are very similar. The output of each stream is sent to a FIFO or FIFOs which can be in external memory. A matching decoder accepts the data from the FIFO(s) and re-decodes and assembles the original symbols.

In a second aspect the invention provides apparatus for decoding context-based adaptive arithmetic entropy encoded data comprising a first decoder for decoding the encoded data to form first decoded data, an encoder for encoding the first decoded data, the encoder using a parallel encoding scheme that includes context-based adaptive arithmetic encoding for at least portions of the decoded data to produce second encoded data, a first in first out (FIFO) memory for storing the second encoded data, and a decoder for reading the second encoded data from the output of the FIFO and decoding the second encoded data to produce the decoded context-based adaptive arithmetic entropy encoded data.

The encoder may be arranged to encode an N-bit symbol, wherein the symbol divided into multiple streams and at least two of the streams are encoded in parallel using a corresponding number of arithmetic encoding units.

The encoder may include a state machine arranged to interpret a specific syntax to select the context for the arithmetic encoder based on the syntax element being processed, the syntax being chosen to ensure that the context is not dependent on the previous symbol.

The decoder may include a state machine arranged to interpret a specific syntax to select the context for the arithmetic decoder based on the syntax element being processed, the syntax being chosen to ensure that the context is not dependent on the previously decoded symbol.

The apparatus may comprise a single FIFO, the encoder comprising means for interleaving the encoded data streams before writing it to the FIFO and the decoder comprising means for de-interleaving the data streams read from the FIFO.

The encoder may comprise means for encoding portions of the data bits representative of each symbol that are likely to be equiprobable or unlikely to be present using a variable length coding scheme.

This enables a minimisation of the cost of the encoder/decoder by reducing the number of arithmetic encoders/decoders required.

BRIEF DESCRIPTION OF THE DRAWINGS

The above and other features and advantages of the invention will be apparent from the following description, by way of example, of embodiments of the invention with reference to the accompanying drawings, in which.

DETAILED DESCRIPTION OF THE PREFERRED EMBODIMENTS

Figure 1:
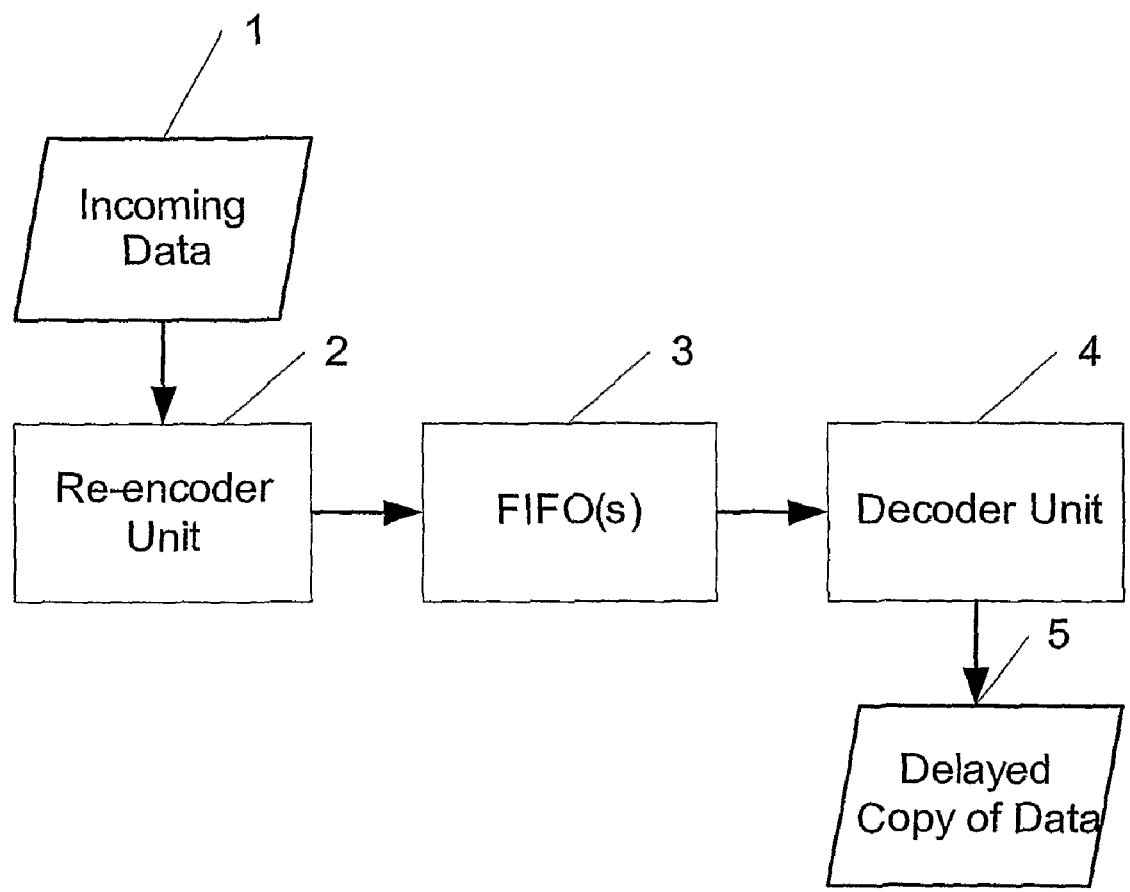
FIG. 1 shows a block schematic diagram of a decoder according to the invention.

FIG. 1 shows an embodiment of the invention in block schematic form.

Compressed data is fed to an upstream decoder unit 1. This decoder unit may, for example, be as defined in the H264 video encoding standard. The decoder 1 supplies values which are formatted into an expected syntax and are input to a re-encoder unit 2 as a stream of 16-bit values. The re-encoder 2 compresses these values and outputs the results to a "first in, first out" (FIFO) memory 3. The FIFO 3 may be a set of FIFOs rather than a single FIFO. A decoder unit 4 reads the compressed data from the FIFO 3 and re-expands the data to obtain the original data stream and pass it to an output 5. It will be apparent that there will be a variable time delay between the encoding and decoding of a particular symbol, depending on how much data is maintained in the FIFO 3. An object of the invention is to enable the allocation of a minimum sized FIFO that will prevent pipeline stalls or at least prevent stalls that stop the system meeting the required frame decode rate. In practice the arrangement may include a means for enabling a central processing unit to monitor the amount of data in the FIFO, 3.

Figure 2:
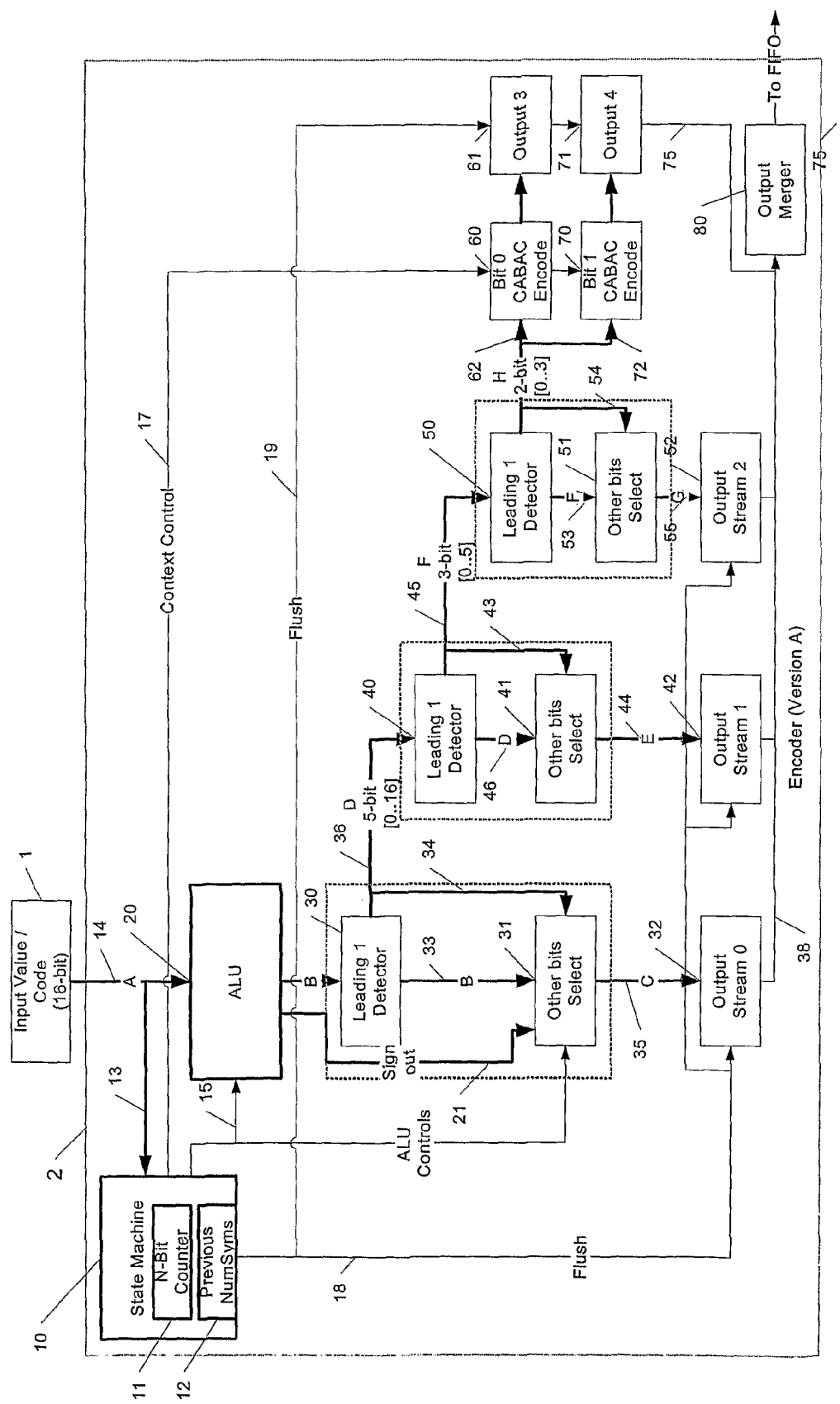
FIG. 2 shows a block diagram of a first embodiment of an encoder unit for use in a decoder according to the invention.

An embodiment of the encoding unit 2 suitable for use in the invention will now be described with reference to FIG. 2. As shown in FIG. 2 an upstream decoder unit 1 supplies a 16-bit value A to the encoder unit 2. This 16-bit value A is fed to a first input of a State Machine 10 via a path 13 and via a path 14 to a first input of an arithmetic and logic unit (ALU) 20. Some of the 16-bit values are used by the syntax for controlling the interpretation of subsequent data. Within the state machine there is an n-bit counter 11 (where n is, for example, 9) and a memory 12 for storing the previous 'number of symbols'. There may, in practice, be multiple 'previous number of symbols' registers, one corresponding to each of the possible encoding modes. The State Machine 10 controls the behaviour of the various sub-units in the re-encoder 2 including the operations performed by the ALU 20. Thus, an output from the State Machine 10 is fed via a line 15 to a second input of the ALU 20 and via a line 16 to a first input of an 'Other bits Select' unit 31.

The ALU 20 receives the 16-bit value A and operates on it, under control of the State Machine 10, to produce two outputs. The first output, which is a sign flag, is fed via a line 21 to a second input of the 'Other bits Select' unit 31 while an unsigned 16-bit value B is fed over a line 22 to a Leading 1 Detector 30 which determines the position of the most significant bit and encodes that as a 5-bit value D in the range (0 to 16) inclusive. For example, if B is 0, D is also 0, while if B is 0x12, then D would be 5. The value B is fed from the Leading 1 Detector 30 to a further input of the 'Other bits Select' unit 31 via a path 33 while the value D is fed via a path 34 from the Leading 1 Detector 30 to a further input of the 'Other bits Select' unit 31. The 'Other bits Select' unit 31 strips the most significant bit from the B value applied over the line 33 and may append the sign flag received over the line 21 to the other bits to produce the value C. This behaviour is precisely described by the following C-pseudo-code:—

```
int FindLeading1Position(int Val)
{
    int count;
    assert(Val >= 0);
    count = 0;
    while(Val)
    {
        Val >>= 1;
        count ++;
    }
    return count;
}
...
D = FindLeading1Position(B);
NumBitsToOutput = MAX(D - 1, 0);
IF(need_to_encode_sign_bit)
{
    BTemp = (B << 1) | SignBit;
    NumBitsToOutput =   NumBitsToOutput + 1;
}
Else
{
    BTemp = B;
}
Output(BTemp, NumBitsToOutput, Stream0);
```

. . . where "Output(Val, Num, Stream)" sends the "Num" least significant bits of "Val" to "Stream".

The resulting number of bits making up the value C can be anywhere from 0 to 16 and these are output over a line 35 to an 'Output Stream 0' unit 32. This may be a small FIFO that collects the bits and outputs entire packets over a path 38 to an Output Merger unit 80.

This may be viewed as a variation on the exponential Golomb encoding scheme employed in the H264 standard except that:

a) it does not require a subtract unit so is very much less expensive to implement in hardware,
b) the length of B, that is the D value, is not encoded with a unary encoding method but is, instead, passed to another encoding unit, and
c) there is a very slight difference in the length of the encoded data that favours small values.

The value D produced by the Leading 1 Detector 30 is fed over a line 36 to an input of a smaller Leading 1 Detector 40 which creates a 3-bit value F which is in the range (0 to 5) inclusive. The value D is fed from the Leading 1 Detector 40 over a path 46 to a further 'Other bits Select' unit 41. The value F is also fed from the Leading 1 Detector 40 to the 'Other bits Select' unit 41 over a path 43. The 'Other bits Select' unit 41 again removes the most significant bit of D and outputs the remaining bits E over a line 44 to an Output Stream 1 unit 42 except for the special case where F=5, that is D=16, and thus E is 0 and hence does not need to be output. This behaviour is described by the following pseudo-code:

```
F = FindLeading1Position(D);
IF((F < 2 ) OR (F==5))
{
    NumBitsToOutput = 0;
}
ELSE
{
    NumBitsToOutput = F – 1;
}
Output(D,   NumBitsToOutput, Stream1);
```

The output of the Output Stream 1 unit 42 is further fed over the path 38 to the Output Merger unit 18.

The 3-bit value F from the Leading 1 Detector 40 is fed over a path 45 to an input of a Leading 1 Detector 50. The Leading 1 Detector 50 produces a 2-bit value H in the range (0 to 3). The 3-bit value F is fed from the Leading 1 Detector 50 over a path 53 to a further 'Other bits Select' unit 51. In addition, the 2-bit value H is fed over a path 54 to the 'Other bits Select' unit 51. The 'Other bits Select' unit 51 removes the implied bits (including any leading 1) to produce an output G. Due to the limited input values of F the output G has a single bit value and is fed over line 55 to an Output Stream 2 unit 52 and thus a maximum of one bit is needed for each encoded symbol. This is described by the following pseudo-code:

```
H = FindLeading1Position(F);
If(H < 2 )
{
    NumBitsToOutput = 0;
}
Else
{
    NumBitsToOutput = 1;
}
Output(F, NumBitsToOutput, Stream2);
```

This can be summarised by the following table

| Binary Input Value: F | Output Bit string: G | H Value |
|---|---|---|
| 000 | "empty" | 00 |
| 001 | "empty" | 01 |
| 010 | 0 | 10 |
| 011 | 1 | 10 |
| 100 | 0 | 11 |
| 101 | 1 | 11 |

Because the 2-bit value, H, will be subsequently encoded using arithmetic encoding, the system can work more efficiently if the encoding of F into G and H is chosen in another way. To this end, in another embodiment of the 'Leading 1 Detector' 50 and 'Other bits Select' unit 51 the following encoding is used as summarised by the following table:

| Binary Input Value: F | Output Bit string: G | H Value |
|---|---|---|
| 000 | "empty" | 00 |
| 001 | 0 | 01 |
| 010 | 1 | 01 |
| 011 | 0 | 10 |
| 100 | 1 | 10 |
| 101 | "empty" | 11 |

Note that the complementary units must be present in the decoder 4 for this alternate embodiment.

In another embodiment, both encoding methods are incorporated into the encoder (and decoder) and the respective state machine chooses the required encoding and decoding method based on the current encoding mode and syntax element to be encoded.

The two bits of the value H are fed from the Leading 1 Detector 50 over a path 62 to a first input of a context-based binary arithmetic encoder 60 and over a path 72 to a first input of a further context-based binary arithmetic encoder 70. These encoders are similar to that used in the H264 encoder except that the number of context maintained is very much reduced. Context controls for the encoders 60 and 70 are produced by the State Machine 10 and fed over a path 17 to second inputs of the encoders 60 and 70. The final bit streams from the encoders 60 and 70 are fed via respective output stream units 61 and 71 over a path 75 to the Output Merger unit 80. The output of the Output Merger unit 80 is encoded data and is fed to the input of the FIFO 3.

Figure 3:
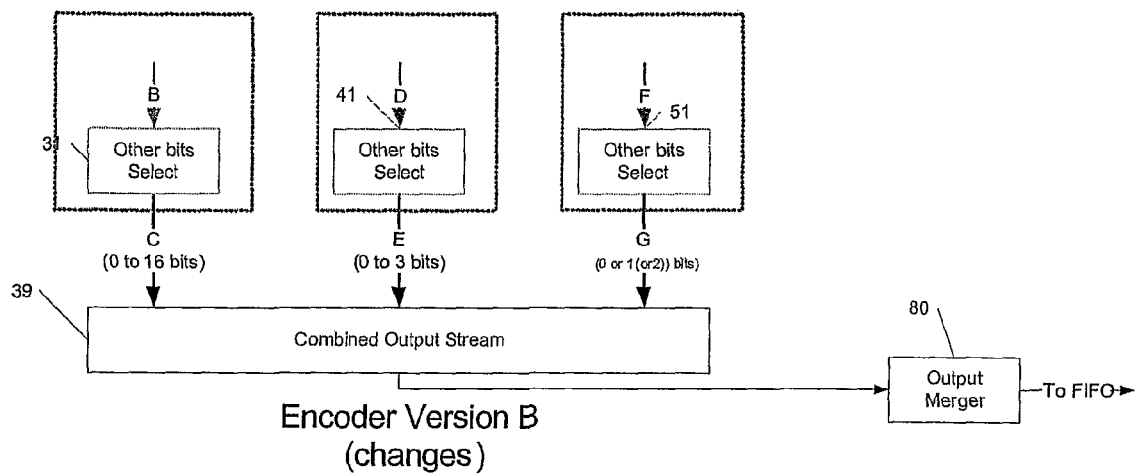
FIG. 3 shows a block diagram of part of a second embodiment of an encoder unit for use in a decoder according to the invention that reduces hardware costs.

In an alternative arrangement as shown in FIG. 3 the embodiment shown in FIG. 2 is modified by replacing the Output Stream 0 unit 32, the Output Stream 1 unit 42, and the Output Stream 2 unit 52, by a single Output Stream unit 39 that concatenates the C, E, and G signals using a small amount of bit shifting hardware. This may reduce the cost of implementation. Note that this change does not affect unrelated parts of the embodiment of FIG. 2 such as the ALU 20.

Before going into further detail on the State Machine 10, ALU 20, and encoder units 60 and 70, it is important to look at the governing syntax for the data stream. This is itself just a stream of 16-bit values, consisting of control values and symbols to be encoded. It is best summarised by the following EBNF (Extended Backus-Naur Form) expressions:

| | |
|---|---|
| RENDEC_Data | ::= Separable_Unit_List; |
| Separable_Unit_List | ::= Separable_Unit\|Separable_Unit Separable_Unit_List; |
| Separable_Unit | ::= Data_Block_List Separable_Unit_End; |
| Separable_Unit_End | ::= UNIT_SEPARATOR 16_BIT_VALUE; |
| Data_Block_List | ::= Data_Block \|Data_Block Data_Block_List; |
| Data_Block | ::= Data_Block_Header NumSymbolsLess1 SymbolList; |
| Data_Block_Header | ::= (RUN_LEVEL_PAIRS\|SIGNED\| SIG_MAP_VALUES) HW_CODE; |
| SymbolList | ::= 16_BIT_VALUE\|16_BIT_VALUE SymbolList; |

Figure 4:
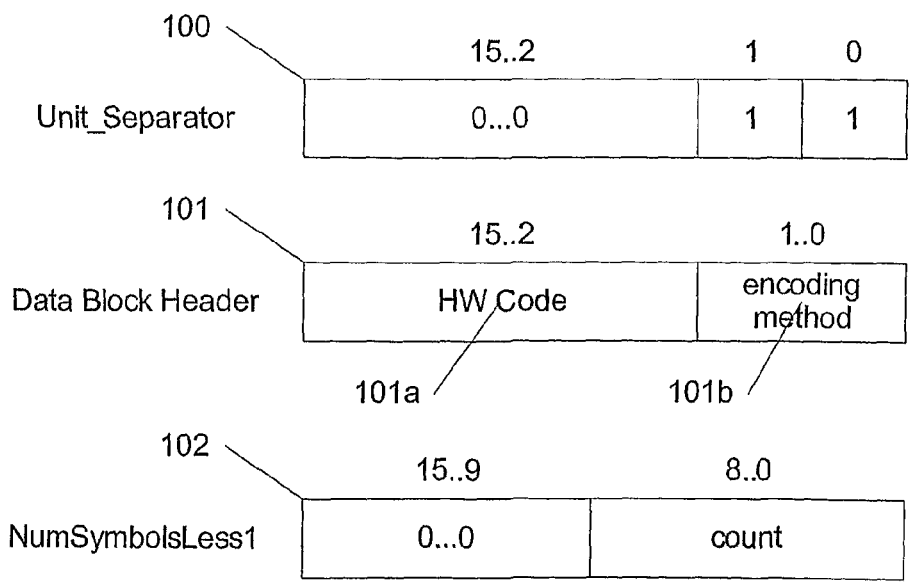
FIG. 4 shows an example of bit encoding of the controlling syntax elements.

As shown in FIG. 4, in the preferred embodiment, "UNIT_SEPARATOR" 100 "Data_Block_Header" 101 and "NumSymbolsLess1" 102 are also "16-bit" values. In this embodiment, "UNIT_SEPARATOR" token is encoded as the 16-bit value, 0x3. The "Data_Block_Header" token 101 consists of two fields—a 14-bit "Hardware_Code" value 101*a* and a 2 bit 'encoding mode' field 101*b*. This latter field encodes the three possible values as:

| Encoding Mode | Bit Pattern |
|---|---|
| RUN_LEVEL_PAIRS | 0b00 |
| SIGNED_VALUES | 0b01 |
| SIG_MAP_VALUES | 0b10 |

Note that with the given encodings, 'UNIT_SEPARATOR' and the 'Data_Block_Header' cannot be mistaken for each other as the last two bits are always different. The values are also chosen so that they can be as numerically small as possible since, as the compression system favours small values, this improves compression efficiency.

The 'HW_CODE' value is an arbitrary field for use by the units on either side of the encoder/decoder module, but it is recommended that small values are chosen whenever possible. The 'Data_Block_Header' contains the encoding method which can be one of RUN_LEVEL_PAIR, SIGNED, or SIG_MAP_VALUES. These names are indicative of their likely intended use but they can be more general purpose. In another embodiment, the SIG_MAP_VALUES mode may be removed or replaced with an alternative encoding scheme, such as one that caters for predominantly larger symbol values. Other combinations or encoding patterns for alternative embodiments will be apparent to one skilled in the art.

The RUN_LEVEL_PAIR mode is optimised for data consisting of a list of pairs where each pair consists of an unsigned value followed by a (non-zero) signed value. The SIGNED mode simply consists of a list of signed values and the SIG_MAP_VALUES consists of a single unsigned value followed by a list of (non-zero) signed values. In all cases it is generally expected that small values will dominate the data.

These encoding methods instruct the State Machine 10 how to process the supplied symbol list, for example selecting what operations the ALU 20 is to perform and what contexts to use in the CABAC encoder units 60 and 70.

The purpose of the "Separable_Unit" logical grouping is to allow the system to have resynchronisation points in the compressed data in the FIFO. The State Machine 10 encoder will flush internal buffers Output Stream 0 unit 32, Output Stream 1 unit 42, and Output Stream 2 unit 52 over a path 18 and Output 3 unit 61 and Output 4 unit 62 over path 19 after each "Separable_Unit" so that, if required, these can, in turn, be skipped by the decoder. For example, in H264, frames consist of some number of independent "slices" which are intended to allow partial error recovery in the event that transmitted data has been corrupted. If the slice is packed into a "separable_unit", it can be skipped in its entirety by decoder and the remaining part of the pipeline. This scheme would also allow several different streams to be intermixed, for example, at the slice level.

Data within each "separable unit" consists of an arbitrary list of Data_Blocks, each of which contains a header, which describes the method of encoding to use, the number of symbols that are to be encoded (less one), and then the symbols to be encoded in the block. A Data_Block will typically be used for a logical group of symbols such as a block of IDCT coefficients or for a set of motion vector values belonging to a macro-block.

Figure 5:
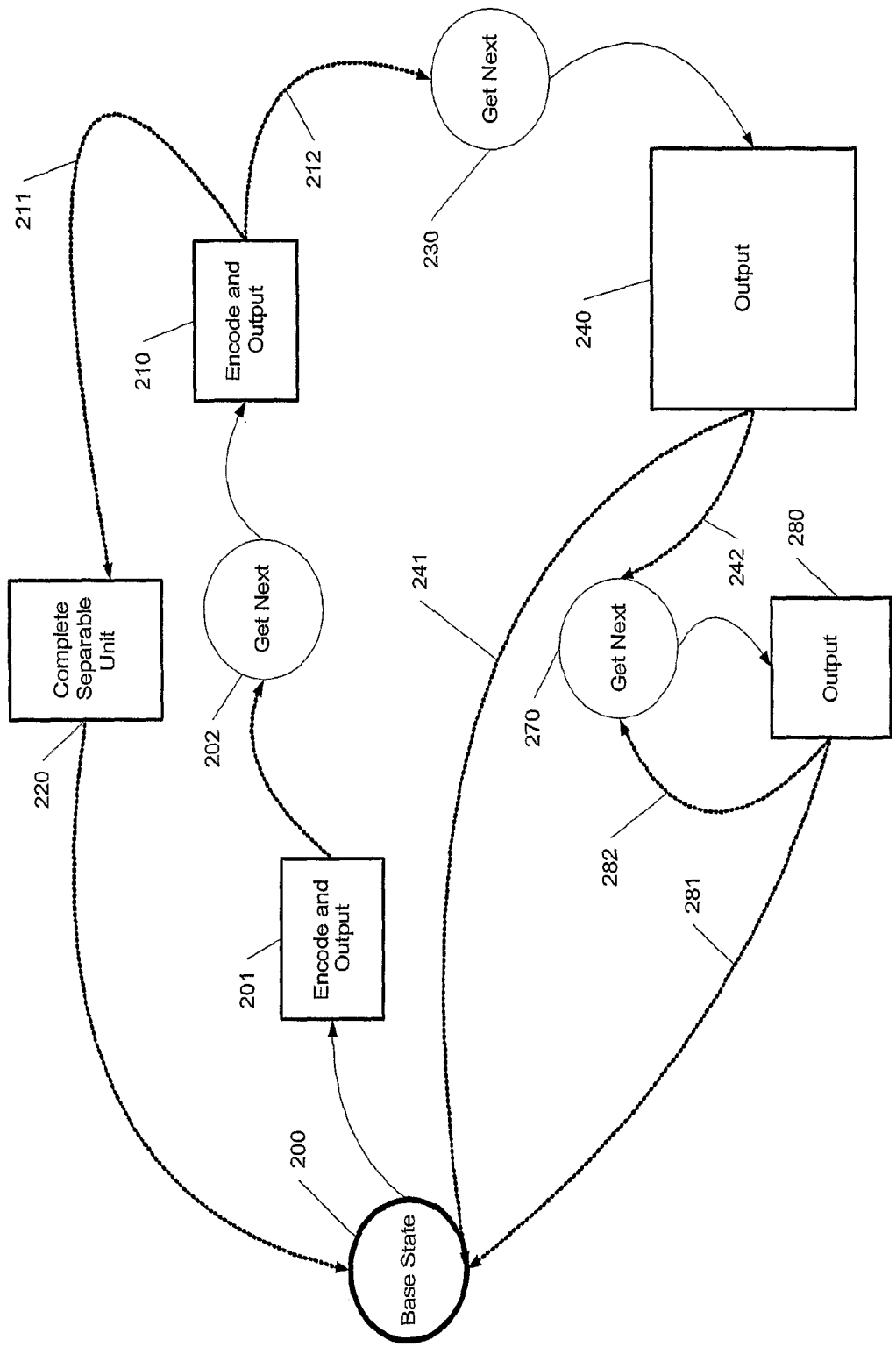
FIG. 5 shows an embodiment of the encoding state machine for processing data presented in the syntax of FIG. 4.

An overview of the state machine for the encoder is shown in FIG. 5. Assuming that the process starts in the base/idle state 200 the next expected data item will either be a 'UNIT_SEPARATOR' or a 'Data_Block_Header'. When either of these values is received it is encoded 201 in exactly the same way for reasons that will become apparent when the decode process is considered. The State Machine 10 progresses to state 202. Both of these symbols are always followed by an 'unsigned' 16-bit value, which is either an arbitrary value or is representative of the length of the data to follow. These values are also both encoded in an identical manner 210. If the previous symbol was the UNIT_SEPARATOR, path 211 is taken and the State Machine 10 informs the encoder to finish the encoding of the "separable_unit", reset the contexts/statistics of the arithmetic encoders, and to flush buffers 220. This may take multiple clock cycles but, as this is expected to be a very infrequent operation, the overall cost is negligible. To achieve this the State Machine 10 issues an instruction over path 18 to cause the contents of buffers 32, 42, 52 to be emptied, over the path 19 to cause the contents of buffers 61 and 71 to be emptied, and over path 17 to reset the context statistics of encoders 60 and 70.

If, instead, the "Data_block_header" was received at state 201, then the State Machine 10 follows path 212 and then expects to receive at least one data symbol 230. This is encoded 240 using the mode defined in the data_block_header. At the same time, the internal counter 11 of State Machine 10 is initialised according to the mode. If the mode is "SIGNED" or "SIG_MAP", it is set to the supplied NumSymbolsLess1, else it is set to NumSymbolsLess1*2+1. The latter is done because "RUN_LEVEL" values are always supplied in pairs and it removes a redundant bit from the supplied value. State 270 and process 280 then encode the remaining symbols supplied in the data block, before returning to the base state 200. Process 208 will cause the counter 11 of the State Machine 10 to decrement and consequently the base state 200 is reached when all the symbols in the data block have been encoded.

The control of the ALU 20, and the context information governing the behaviour of the arithmetic encoders 60 and 70 will now described. Unlike the H264 CABAC, which has literally hundreds of contexts, the preferred embodiment only has a set of six groups of contexts. Each group has a pair of context values—one for each of the two CABAC units. (A context, for all intents and purposes, stores the current probabilities of the two binary values, 0 and 1. In the H264 CABAC design, this is packed into an 8-bit value. For ease of implementation, the same scheme may used by an embodiment).

Figure 6:
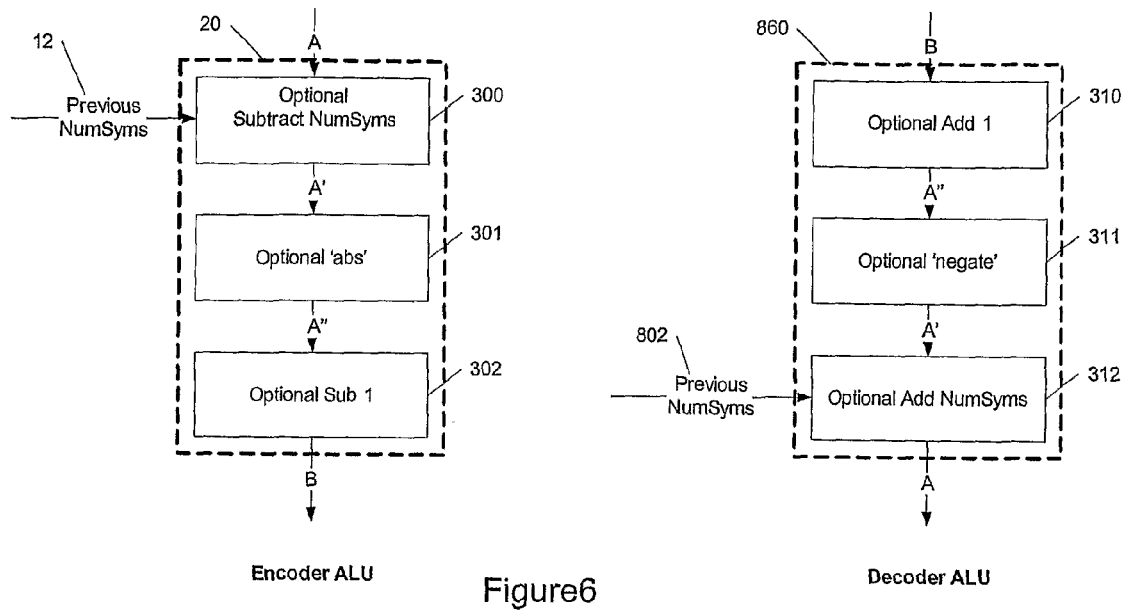
FIG. 6 shows an embodiment of the ALU units for use in the encoder (and matching decoders) of FIG. 2 or FIG. 3.

Also associated with each group, are the settings for the operations performed by the ALU, 20. These operations will now be described with reference to FIG. 6. There are three optional operations that can be performed on the incoming data value, A, to produce the output value, B. It should be noted that in the diagram, these are described as three serial stages. This is done purely for clarity and a hardware system may combine these operations, if doing so reduces area and/ or improves timing. If any option is not enabled, the input to that option is passed to its output.

The first option 300 subtracts the previous NumSymbolsLess1 value 12 from the incoming value, A, to produce A'. In 'C pseudo code' this operation is:

```
IF(option_300_enabled)
{
    A' = A – Prev_NumSyms;
}
ELSE
{
    A' = A;
}
```

The second optional operation, 301, computes the absolute value of its input, A', and also outputs the original sign value flag. In 'C pseudo code' this operation is:

```
IF(Option_301_enabled)
{
    If(A' <0)
    {
        A" = –A';
        Sign_out = 1;
    }
    Else
    {
        A" = A';
        Sign_out = 0;
    }
}
Else
{
    A" = A';
    Sign_out = 0;
}
```

Finally, option 302 subtracts one from the input value, A" and keeps the least significant 16 bits. In 'C pseudo code' this operation is:

```
IF(option_302_enabled)
{
    B = (A" – 1) & 0xFFFF;
}
ELSE
{
    B = A";
}
```

The six context groups and their settings for the ALU are summarised in the following table:

| Context | | ALU Operations | | | CABAC Initial Probability of = 0 | |
|---|---|---|---|---|---|---|
| | | '300' (subtract previous) | '301' | '302' | | |
| Group | Description | ous) | ABS | Sub 1 | Bit 0 | Bit 1 |
| S | Used for Signed values mode | NOP | NOP | NOP | 0.28 | 0.97 |
| RL_U | Used for the Unsigned values in the Run_Level mode | NOP | NOP | NOP | 0.44 | 0.98 |
| SM_M | Used for the (unsigned) significance map in the SIGMAP mode | NOP | NOP | Enable | — | — |
| S_NZ | Used for the Signed values in the Run_Level and SIGMAP modes. Assumes a Low probability of "0" | NOP | Enable | Enable | 0.84 | 0.99 |
| Delta-Length | Used when encoding the length of a chunk or the value stored after a UNIT_SEPARATOR | Enable | Enable | NOP | 0.31 | 0.98 |
| Header | Used when encoding a header | NOP | NOP | NOP | 0.84 | 0.99 |

The initial probability values for the contexts, which are assigned to the contexts at the beginning of each 'Separable_Unit', are given for example purposes only. In the preferred embodiment, these values would be obtained from a set of registers that can be programmed, for example, by a CPU. The example values were also created by an embodiment that does not require the SIGMAP encode mode and hence initial probabilities for it are not included.

The relationship of the context groups and the states described in FIG. 5 will now be discussed.

In state 201, the 'Header' group is chosen.

In state 210, the 'Delta-Length' group is used. As can be seen from the table, the supplied "length-1" value is subtracted from the previous value, and the absolute value of the result is taken. This result (and the original sign of the subtraction result) is encoded.

In states 240 and 280 the symbol values are encoded using one of the remaining four context groups, 'S', 'RL_U', 'SM_M' or 'S_NZ' depending on the encoding mode specified in the header data. When encoding using the 'SIGNED' mode, the 'S' group is used for all remaining values in the data block.

When encoding the 'RUN_LEVEL' mode, the chosen group alternates between 'RL_U' and 'S_NZ', whilst for the 'SIGMAP' mode the first symbol is encoded with 'SM_M' mode and the remainder with 'S_NZ'.

When there are multiple streams produced by the embodiment, it is preferable to have a single FIFO because this means that the system does not need to split the available external memory space, a priori, into multiple fixed-sized FIFOs. Thus, in an embodiment where there is a single external FIFO, there should preferably be an efficient means of interleaving the various output streams in the encoder, and then de-interleaving these when the data is read into the decoder. This is actually a non-trivial task for several reasons:

a) the streams will each produce a different number of bits per symbol;
b) for a particular symbol 'x', while the bits corresponding to 'C', 'E' and 'G' will be produced almost immediately, the arithmetic encoders may not produce their encoded bits until some number of symbols later. In some circumstances this could be tens or even hundreds of symbols later; and
c) to begin decoding a symbol, all the relevant data for the streams must be available at the same time in the decoder.

In addition, the memory subsystem should be used efficiently. In many systems, this means that reads and writes must be done in bursts of a certain size, which may require tens to hundreds of bytes. Randomly accessing individual bytes, for example, would not be efficient.

Figure 7:
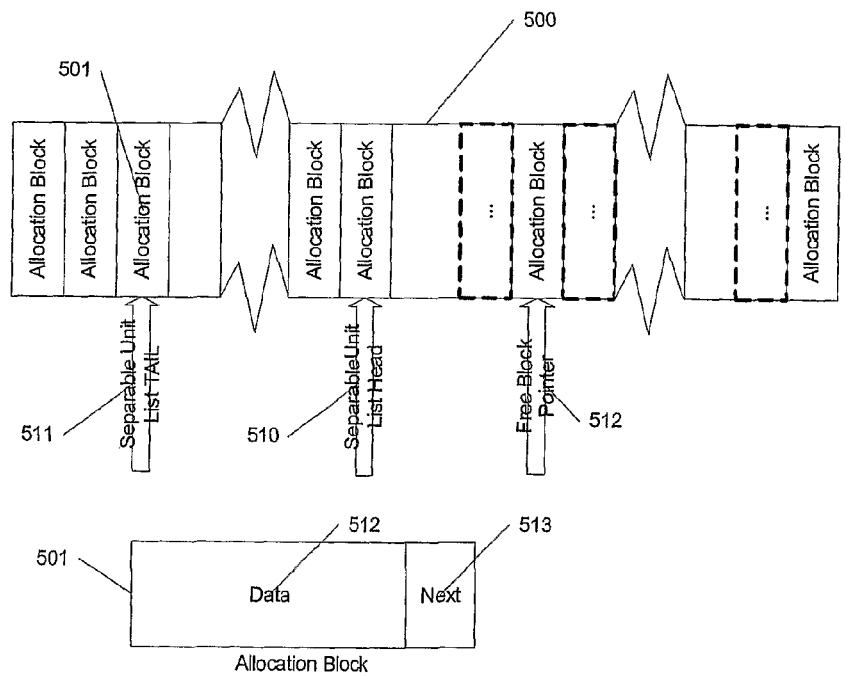
FIG. 7 shows an arrangement for interleaving data when a single FIFO is used.

A solution to this problem is now described with reference to FIG. 7. The FIFO memory 500 which, in this embodiment, will be approximately 4 Mbytes in size, is logically divided into fixed-sized 'allocation blocks' 501, wherein each block is preferably chosen to be a multiple of the minimum efficient memory transfer burst size. In the preferred embodiment, each block is 256 bits in size. Three "pointers" into the FIFO memory are maintained. The "Separable Unit Head" 510 points to the start of the data for the separable unit currently being stored by the encoder 2. The "Separable Unit Tail" 511 points to the start of the separable unit currently being processed by the decoder 4. If this ever advances to be the same as the "Separable Unit Head" pointer, the decoder stalls until the encoder finishes its current separable unit.

The "Free Block Pointer" 512 is incremented as the encoder produces a new block's worth of data from one of its output streams. Should this reach the end of the FIFO's memory block, it wraps around to the start. If the "Free Block Pointer" reaches the "Separable Unit Tail", then the FIFO is deemed full, and the encoder stalls until the decoder finishes its current separable unit and advances the pointer to the start of the next stored separable block.

Each allocation block contains a data portion 512 and a 'next' pointer 513. In the preferred embodiment, the 'next pointer' is a 16-bit value. This indexes the 'next' allocation block in a chain of blocks, and is used as follows:

Inside the merge unit 80 of an embodiment with N output streams, at the start of a new 'separable unit', the first N allocation blocks, relative to the start of the current separable block (which will be equal to the "Free Block pointer"), are pre-assigned to the N streams and the "Free Block Pointer" is advanced by N. The merge unit contains N buffers (or more if multiply buffered) of the size of the allocation unit, and N 16-bit address values, A[0] . . . A[N−1]. The address values are initialised to be the values "Separable Unit Head" through to "Separable Unit Head+(N−1)" respectively. As data is supplied by the corresponding stream, [i], the merge unit begins filling, in parallel, each buffer [i]. When buffer [j] becomes full, the 'next pointer' in buffer [j] is set to the value of the "Free Block Pointer", buffer [j] is written to the address in A[j], A[j] is set to "Free Block Pointer", and the "Free Block Pointer" is incremented.

A matching demerge unit, as would be required in the decoder, 4, would simply read the blocks and forward the contents to their respective streams. The next block to read for a particular is indicated by the pointer contained in the currently read block.

Figure 8:
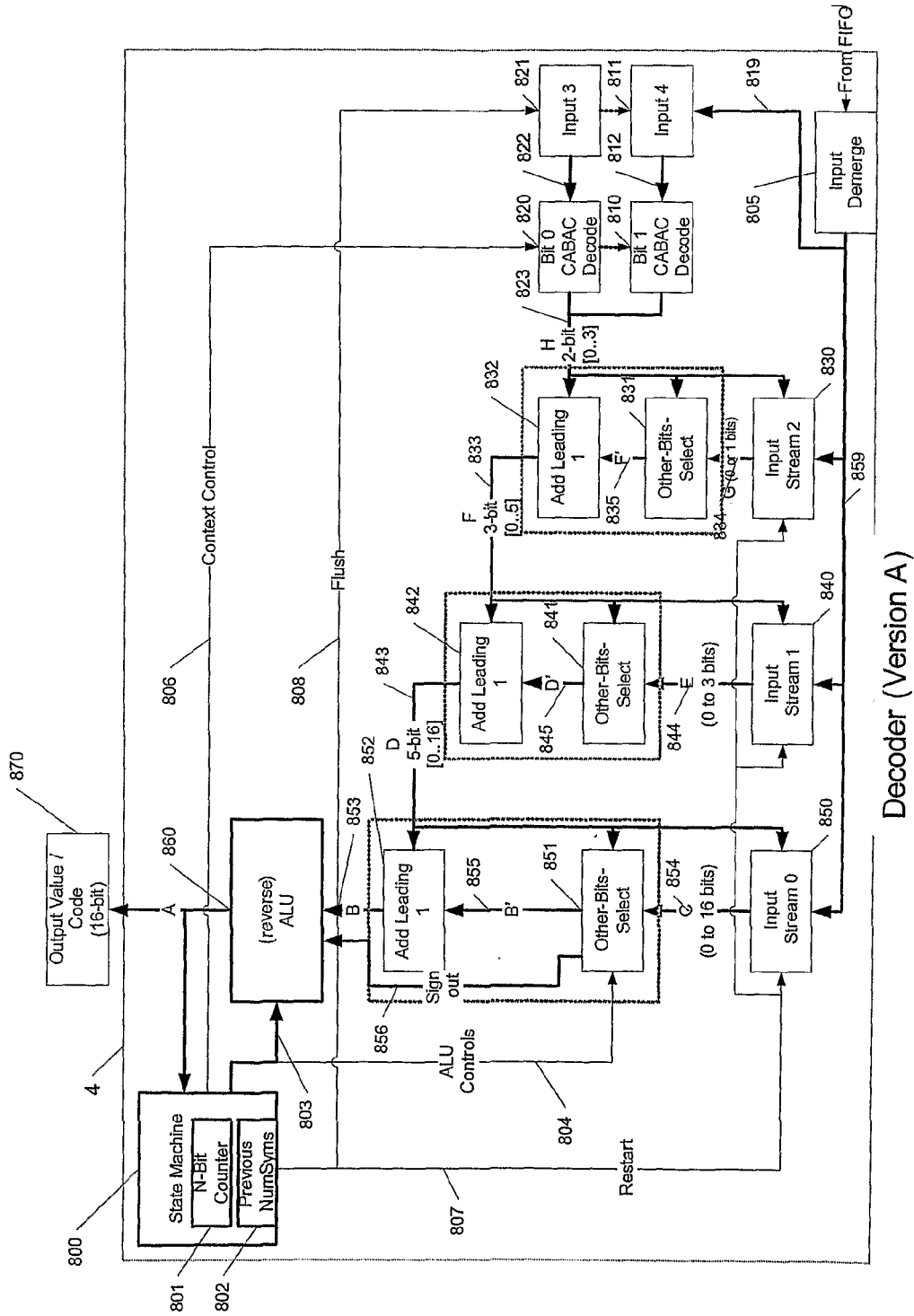
FIG. 8 shows a block diagram of an embodiment of a matching decoder for the encoder shown in FIG. 2.

The decoder 4 performs a decoding process which is essentially just the reverse of the encode process. FIG. 8 shows a block schematic form of a decoder suitable for decoding encoded data produced by the encoder of FIG. 2.

The decoder shown in FIG. 8 comprises a State Machine 800 which includes an N-bit counter 801 and a previous number symbols register 802. An output of the State Machine 800 is connected to an input of an Arithmetic and Logic Unit (ALU) 860 over a path 803 and to an input of an Other-Bits-Select unit 851 over a path 804. An Input Demerge Unit 805 divides the data received from the FIFO into parallel streams and has an output that is connected over a path 859 to Input Stream 0 unit 850, Input Stream 1 unit 840, and Input Stream 2 unit 830 and over a path 819 to an Input 3 unit 821 and an Input 4 unit 811. The State Machine 800 has a further output which is connected via a path 806 to inputs of two context-based adaptive arithmetic (CABAC) decoders 810 and 820. This path selects the context used in 810 and 820 to decode the current bits. The Input 3 unit 821 has an output that is connected to a further input of the CABAC decoder 820 over a path 822 while the Input 4 unit 811 has an output that is connected to a further input of the CABAC decoder 810 over a path 812.

The outputs of the CABAC decoders 810 and 820 are connected via a path 823 to inputs of an Add Leading 1 unit 832 and an Other-Bits-Select unit 831. The output of the Add Leading 1 unit 832 is connected via a path 833 to inputs of a further Add Leading 1 unit 842 and a further Other-Bits-Select unit 841. The output of the Add Leading 1 unit 842 is connected to inputs of the final Add Leading 1 unit 852 and the final Other-Bits-Select unit 851 over a path 843. The output of the Add Leading 1 unit 852 is connected to a further input of the ALU 860 over a path 853.

The output of the Input stream 2 unit 830 is connected to a further input of the Other bits Select unit 831 over a path 834. Similarly, the output of the Input Stream 1 unit 840 is connected to a further input of the Other bits Select unit 841 over a path 844 while the output of the Input Stream 0 unit 850 is connected to a further input of the Other bits Select unit 851 over a path 854.

The output of the Other-Bits-Select unit 831 is connected via a path 835 to a further input of the Add Leading 1 unit 832. Similarly the output of the Other-Bits-Select unit 841 is connected via a path 845 to a further input of the Add leading 1 unit 842 and the output of the Other-Bits-Select unit 851 is connected via a path 855 to a further input of the Add Leading 1 unit 852. A further output of the Other-Bits-Select unit 851, which optionally contains a decoded sign flag, is connected via a path 856 to a further input of the ALU 860.

A further restart output of the State Machine 800 is connected over a path 807 to reset inputs of the Input Stream 0 unit 850, the Input Stream 1 unit 840 and the Input Stream 2 unit 830 while the same output of the State Machine 800 is fed over a path 808 to reset inputs of Input 3 unit 821 and Input 4 unit 811. This restart output is signaled by the State Machine 800 at the start of each Separable_Unit.

In operation, data from the FIFO 3 is fed to an input demerge unit 805 that produces five data streams that are fed to input data stream 0 unit 850, input stream 1 unit 840, input stream 2 unit 830, input 3 unit 821, and input 4 unit 811. The input 3 unit 821 feeds a portion of the data stream to the CABAC decoder 820 as bit 0 data while the input 4 unit 811 feeds a portion of the data stream to the CABAC decoder 810. The CABAC decoders 810 and 820 reproduce the signal H that was originally fed to the encoders 60 and 70 of FIG. 2.

It should be noted at this point that because the defined syntax isolates the context selection for the arithmetic decoder from the value of the immediately previous symbol a hardware decoder can afford to have a pipeline stage inserted somewhere in the decoding stages and it will not incur a stall. A convenient location for such a pipeline stage is at the point that H is calculated. The value of H is fed to the 'Other bits Select' unit 831 and to the Add Leading 1 unit 832. The Input Stream 2 unit 830 selects from the input demerge streams the value G and applies this to the 'Other bits Select' unit 831. The Other bits Select' unit 831 generates the value F from the value of G in response to the value of H. The Add Leading 1 unit 832 adds a new most significant bit according to the position specified by the value H to produce the 3-bit value F. This is the reverse of the process performed by the encoder units 50 to 52.

The 3-bit value F produced at the output of the Add Leading 1 unit 832 is fed to the first input of the further Add Leading 1 unit 842 and to the first input of the further 'Other bits Select' unit 841. Input Stream 1 unit 840 feeds the value E to the second input of the 'Other bits Select' unit 841. The 'Other bits Select' unit 841 takes the values E and F at its inputs and produces the value D. The value D is fed to the second input of the Add Leading 1 unit 842, which produces at its output a 5-bit value for the data D. The output from the Add Leading 1 unit 842 is fed to a first input of the further Add Leading 1 unit 852 and to the first input of the further 'Other bits Select' unit 851. The 'Other bits Select' unit 851 receives a signal C from the output of the Input Stream 0 unit 850 at its second input. This is the reverse of the process performed by the encoder units 40, 41 and 42.

The 'Other bits Select' unit 851 also receives a control input from a State Machine 800 over path 804. The 'Other bits Select' unit 851 also receives a control input from a State Machine 800 over path 804. The 'Other bits Select' unit 851 produces an output signal B which is fed to a second input of an Add Leading 1 unit 852. The 'Other bits Select' unit 851 also produces a 'sign out' output which is fed to an input of an arithmetic and logic unit (ALU) 860 over a path 856. The Add Leading 1 unit 852 produces the signal B at its output and feeds that to further input of the ALU 860. This is the reverse of the process performed by the encoder units 30, 31 and 32. For illustrative purposes, the functioning of units 850, 851 and 852 will now be given in pseudo-code.

```
/*Unit 850*/
If(NeededToEncodeSignBit)
{
    NumberofBitsToRead = D;
}
Else
{
    NumberofBitsToRead = max(D-1, 0);
}
    C = GetNextNbitsFromStream(
            Stream_0,
            NumberofBitsToRead);
/*unit 851*/
If(NeededToEncodeSignBit)
{
    B' = C >> 1;
    Sign_bit = C & 1;
}
Else
{
    B' = C;
    Sign_bit =0;    /*or don't care*/
}
/*unit 852*/
If(D > 0)
{
    B = B' | (1 << (D-1));
}
Else
{
    B = 0;
}
```

. . . where "GetNextNbitsFromStream(stream, N)" extracts the next N bits from the bitstream, stream.

The State Machine 800 produces an output which is fed to the decoders 820 and 810 over which the context control data is transferred via a path 806. The State Machine 800 also produces a control output which is fed to a further input of the ALU 860 over a path 803. A further output from the State Machine 800 produces a restart signal which is fed to inputs of the Input Stream 0 unit 850, the Input Stream 1 unit 840 and the Input Stream 2 unit 830 and a flush signal which is fed to the Input 3 unit 821 and Input 4 unit 811. The arithmetic and logic unit 860 produces an output A which is the output value code and which is also fed to the State Machine 800. The decoder effectively performs the reverse function from the encoder shown in FIG. 2 and thus reproduces the data that is fed from the H264 decoder to the encoder shown in FIG. 2.

Returning to FIG. 6, we now describe the behaviour of the decoder ALU 860. In essence, it performs the reverse of the operations of the encoder ALU 20, in that it converts the 'B' value back to 'A'. Referring again to the contexts in the Table, if subunit 302 is enabled in the encoder for a given context, then the 'add 1' unit 310 will be enabled in the decoder ALU when that context is used in the decoder. Similarly, for cases where unit 301 is enabled for an encode, then the "optional negate" unit 311 will be enabled. Finally, when unit 300 is enabled for a context in the encode procedure, then Add previous NumSyms 312 will be enabled for that context in the decode procedure. Unit 311 is described by the following pseudocode:

```
IF(Option_311_enabled)
{
    IF(sign_out == 1)
    {
        A' = -A'';
    }
    Else
    {
        A' = A'';
    }
}
Else
{
    A' = A'';
}
```

Given the previous descriptions of units 300 and 302, the operations performed by units 310 and 312 will be apparent to anyone skilled in the art.

Figure 9:
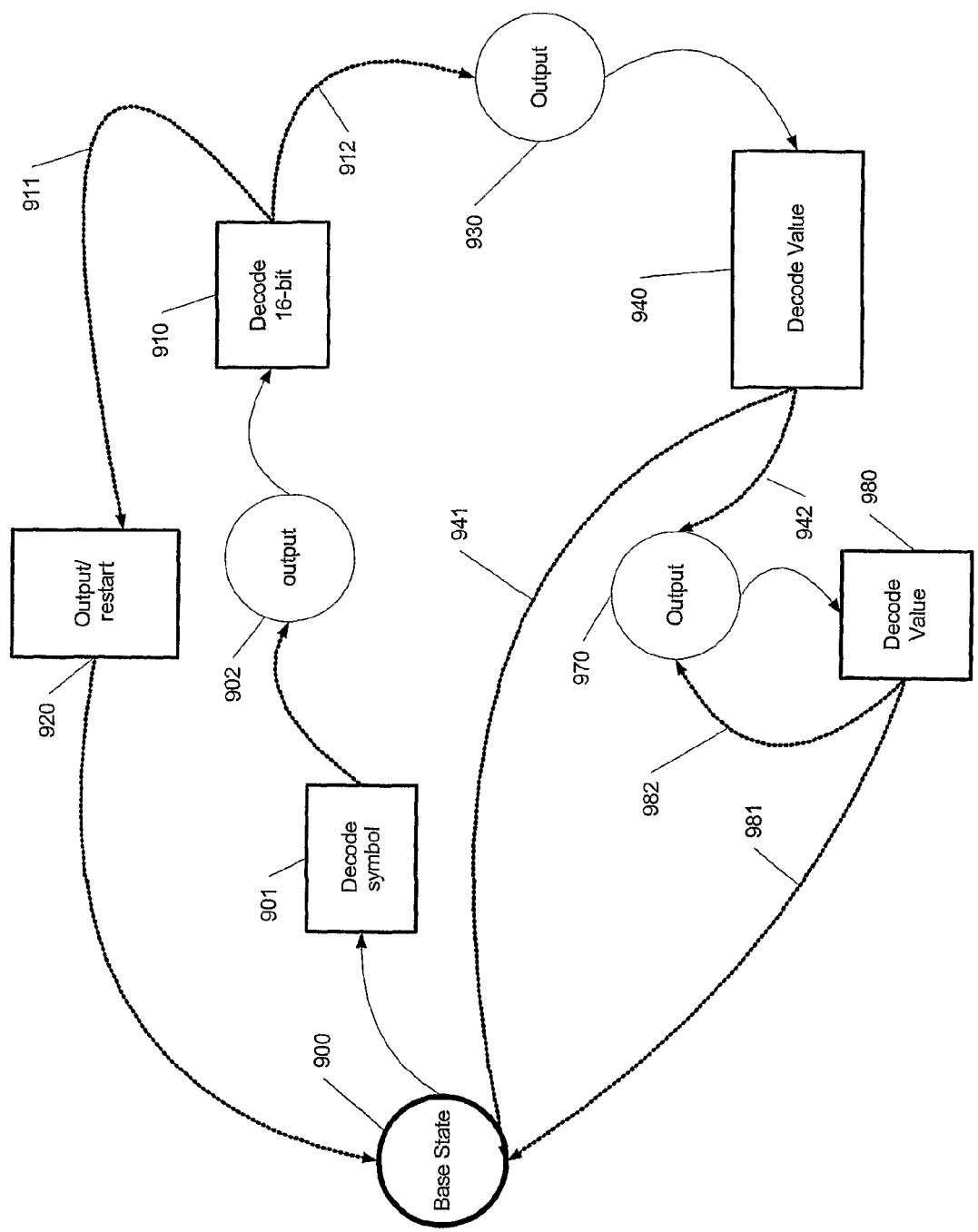
FIG. 9 shows an embodiment of the decoding state machine for processing data presented in the syntax of FIG. 4.

The decoder state machine 800, the behaviour of which is shown in FIG. 9, mimics that of the encoder's State Machine 10 behaviour of FIG. 5. Assuming the process starts in the base/idle state 900 the system decodes 901 a (16-bit) symbol which is output to the subsequent system 5. The State Machine 800 then expects to decode another 16-bit value 910. If the value decoded at 901 was a UNIT_SEPARATOR, the decoder takes path 911 to stage 920, which finishes output, re-initialises the encoder statistics, and resets the input buffers, before returning to state 900.

If, instead, the value decoded at 901 was a Data_Block_Header, then the system decodes the first data symbol 940, then iterates through the remaining symbols, using the count value decoded in step 910 which is stored in the counter 801 before finally returning to state 900.

Note that because the syntax never makes a 'branch' decision based on the immediately previous symbol, some of the decoding of one symbol can be overlapped with the decoding of the next, allowing easier hardware pipelining. For example, it is possible to start decoding in unit 910 before steps 901 and 902 are complete.

As stated, the given syntax allows easier pipelining of the hardware, but it is by no means the only possible syntax that could be used which has this property. In fact the described syntax may not be suitable for all applications. With the described syntax, the number of symbols to be encoded in a "data block" must be sent to the encoder 2 before sending the data. In some applications this information may not be known in advance and so might be impossible or at least involve expensive buffering. An alternative syntax that does not have this restriction is

```
Data_Block      ::=
    Data_Block_Header    SymbolListWithTerminate;
SymbolListWithTerminate    ::=
    RESERVED_TERMINATE_VALUE
    NON_RESERVED_16_BIT_VALUE |
    NON_RESERVED_16_BIT_VALUE
SymbolListWithTerminate;
```

With this syntax, one 16-bit value, for example zero, is reserved and identifies the following value as being "the last". All values are then adjusted so that they don't accidentally use the reserved value. Other schemes, for example using escape codes, will be apparent to one skilled in the art. The given embodiments can be modified to utilise this or other alternative syntaxes.

It can be seen that the present invention enables the use of a minimum sized FIFO by re-encoding the decoded incoming data into a second parallel entropy encoded scheme using context based adaptive arithmetic encoding for portions of the data, the number of contexts being reduced from that used in the H264 standard and the syntax being selected to make the context independent of the immediately previously decoded symbol in order to enable a decoder to decode the encoded data with less variation in the time taken to decode particular portions of the encoded data.

Figure 10:
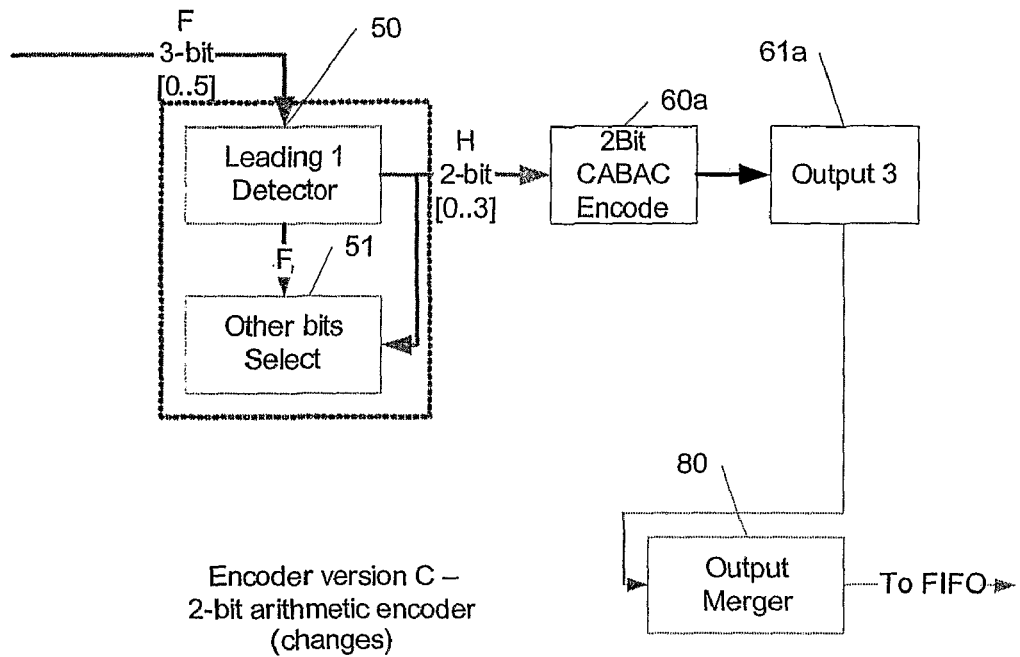
FIG. 10 shows a variation on the embodiments of FIG. 2 and FIG. 3 that uses an arithmetic encoder that encodes two bits at a time.
Figure 11:
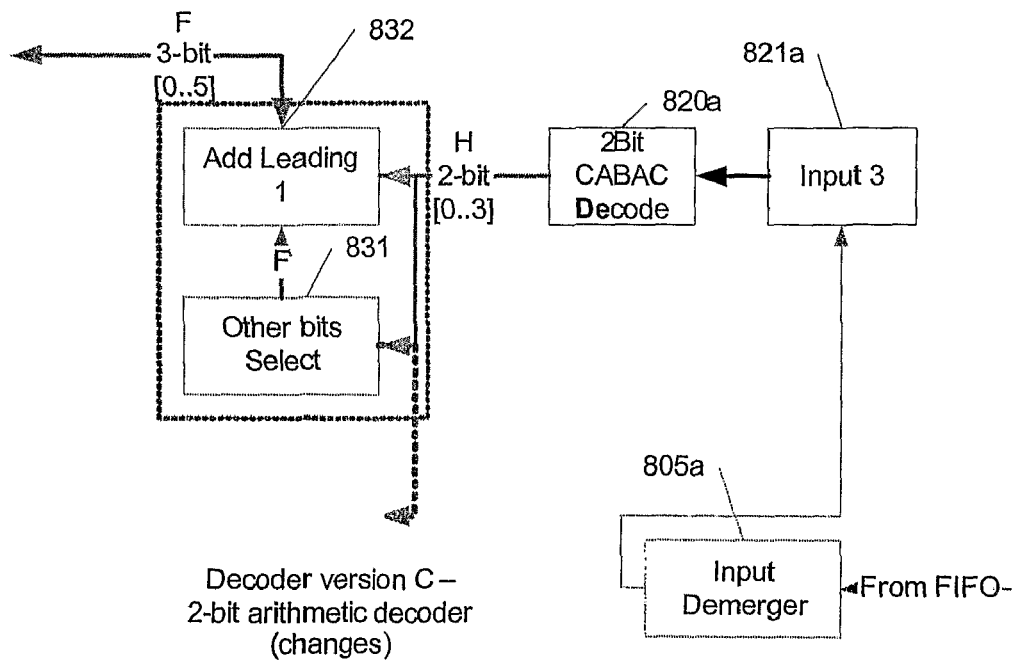
FIG. 11 shows an embodiment of a decoder for decoding data encoded by an encoder as shown in FIG. 10.
Figure 12:
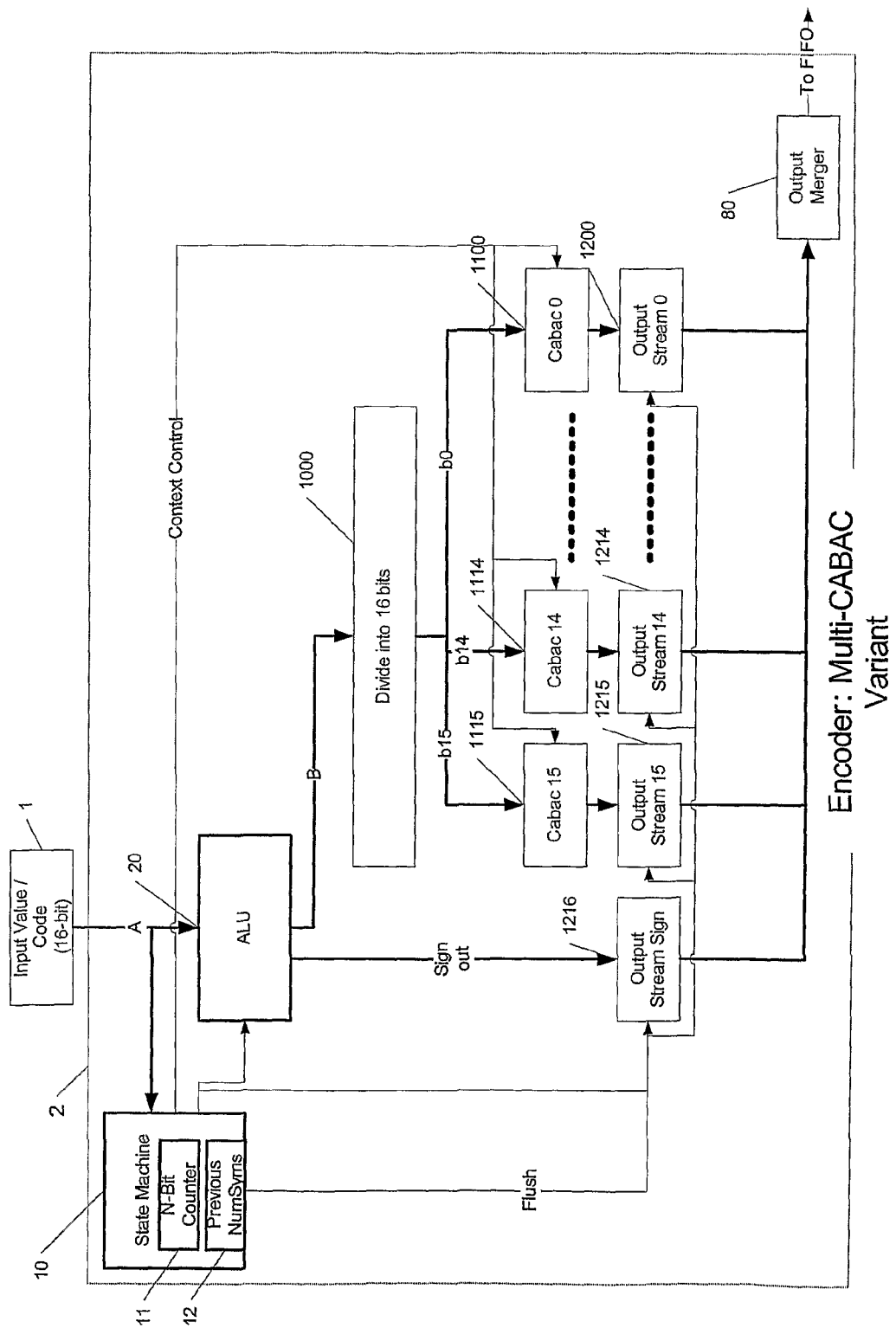
FIG. 12 shows an alternative embodiment of an encoder that only uses arithmetic encoding.

In an alternative embodiment of the encoder to that described with reference to FIG. 2, as illustrated in FIG. 10, the two single-bit CABAC encoder units 60 and 61 and associated stream data units 61 and 71 in the encoder 2 are replaced with a single 'CABAC' encoder 60a, that directly encodes 2-bits at a time and outputs to a single stream output unit 61a. Although this single CABAC encoder 61a is more expensive (approximate cost is O(4)), than either 60 or 61 (cost ~O(2)), it will be slightly cheaper than the combined units, and also eliminates the need for one of the output streams. Naturally, an equivalent 2-bit CABAC decoder unit will be present in a matching decoder 4 as illustrated in FIG. 11. Here the Input Demerger 805a supplies data to the input 3 FIFO 821a which in turn supplies data to the 2-bit CABAC decode unit 820a. This produces both bits of value H which are supplied to the Other-Bits-select unit 831 and Add Leading 1 unit 832 as before. An embodiment employing this system also has the advantage over the previous embodiments in that each of the four possible values of H has its own precise probability value and thus will give a higher compression factor. (In the previous embodiments, the probabilities of each value of H were effectively formed from the product of the probabilities of the two bits forming H, and thus these can interact in a less than optimal manner.)

In a further alternative embodiment, the 2-bit encoder/decoder embodiment of FIG. 10 is combined with the changes made in the embodiment shown in FIG. 3, (along with the matching unit for the decoder). In this embodiment, the number of output streams is reduced to just two—corresponding to encoder units 39 and 61a. This embodiment forgoes the merging structure of FIG. 7 and units 80 and 805 and simply maintains two independent FIFOs between the encoder and decoder units.

In the embodiments described above, the majority of the more significant bits of to the data to be encoded, have been handled with a 'direct encoding' scheme and thus, when present, assume a 50:50 probability for each bit. Some improvement in the compression ratio can be obtained, at the cost of a more expensive implementation, by encoding some of these bits with arithmetic encoding. From analysis of typical video data, when the value B has the leading significant bit removed, then typical probabilities of the next five most significant bits of B (when they exist) being zero, are summarised by the following table:

| Bit Number: | Probability of being 0 | Probability of being present |
|---|---|---|
| "N-1" | 0.68 | 0.18 |
| "N-2" | 0.61 | 0.07 |
| "N-3" | 0.58 | 0.02 |
| "N-4" | 0.55 | 0.001 |
| "N-5" | 0.53 | <0.001 |

As can be seen, there is a greater than 50:50 probability of these bits being zero and so a greater level of compression can be achieved by encoding some number of the next most significant bits with arithmetic encoders/decoders. However, given the expense of arithmetic encoding, it is important to note that adding more arithmetic encode/decode units will result in rapidly diminishing returns.

For example, the probability that such bits will actually be present in each symbol that is encoded drops off extremely fast, as is summarised by the third column in the table. Since the embodiments presented imply the position of the most significant bit, there is effectively no storage cost for bits that aren't used.

Therefore, in such an embodiment, it would only be cost effective to encode, at most, the next most significant value using arithmetic encoding.

In a conceptually simpler, but generally less efficient alternative embodiment, as illustrated in FIG. 11 the value B, apart from the sign bits which are equiprobable, is encoded just using context-based arithmetic encoder units. The value B is split 1000 into 16 bits, and each bit, numbered from 15, the most significant, to 0, the least significant, is fed to its own respective CABAC unit, indicated by 1115 to 1100 respectively. The output streams from these, 1215 to 1200 and, when present, the sign bit value stream 1216 are then merged, as before, through unit 80.

In an extension to any of the suggested embodiments (for example FIG. 2 or FIG. 10), M encoders can be used in parallel to increase the encoding rate. The 16-bit symbols are sent, in round-robin order, to each of the M encoders in turn. Similarly, each decoder would produce a result in turn. In such a scheme, some simplifications would be possible.
a) The individual encoders/decoders can run more slowly since the increased parallelism would offset slower encoding rates of the individual units.
b) Because the decoders are working in parallel, the contexts would be simplified since it is not possible to know the state of a decoder that is decoding a previous symbol without incurring serialisation penalties.

In another embodiment, that extends on the previous embodiment, each encoder uses arithmetic encoding for all the data through the inclusion of a "binarising unit" that first converts the input value to a VLC format, preferably Exponential Golomb. Each encoder then encodes that VLC over multiple clock cycles, one bit at a time, using its own arithmetic encoder. Each bit position preferably has its own context. The number M is chosen so that it is greater than the average number of VLC bits needed to encode each symbol, thus allowing, on average, the re-encoder and decoder to run faster than 1 symbol per clock, apart from very rare circumstances.

These last embodiments of the invention, however, may not achieve the same compression performance as the previous embodiments as the encoding/decoding units cannot share statistics without introducing dependencies, and hence serialisation, between the encoding/decoding tasks.

The invention can also be applied to other video encoding standards, for example VC1, or perhaps audio encoding standards thus allowing simpler front-end entropy decoding units to be employed. Similarly, other (non-video) systems that have data that is not evenly distributed (i.e. is compressible) and must be rate-filtered (for example received in bursts, perhaps via some transmission system) via a FIFO could benefit from this invention.

In view of the foregoing it will be appreciated that the inventive concept resides in the following method:

A method for rate smoothing an entropy decoding scheme comprising the steps of:
  a) translating the first entropy encoded representation to the decoded representation;
  b) encoding the decoded representation into a second entropy encoded scheme that uses a parallel encoding scheme including context-based adaptive arithmetic encoding for portions of the data;
  c) storing said second encoded data in a FIFO;
  d) retrieving second data from the FIFO; and
  e) decoding second data into decoded data.

The method may further comprise using an inexpensive encoding technique for data that is nearly equiprobable or has very low frequency of occurrence and using arithmetic coding for the other parts.

The method may still further comprise application of a control syntax that decouples the decode context by at least one symbol.

The invention claimed is:

1. A method of decoding context based adaptive arithmetic entropy coded data comprising the steps of;
  a) decoding first encoded data to produce first decoded data,
  b) entropy encoding the first decoded data using a parallel encoding scheme that includes context-based adaptive arithmetic encoding for at least portions of symbols contained in the first decoded data to produce second encoded data, an N-bit symbol being encoded and divided into multiple streams, at least two of the streams being encoded in parallel using a corresponding number of arithmetic encoding units,
  c) storing the second encoded data in a first in first out, FIFO, memory,
  d) reading the second encoded data from the FIFO memory, and
  e) decoding the second encoded data read from the FIFO memory to produce second decoded data, the second decoded data being the decoded entropy coded data.

2. A method as claimed in claim 1 in which in step b) the number of contexts is smaller than those used for originally encoding the data.

3. A method as claimed in claim 1 in which in step b) a specific syntax is interpreted and the context for the arithmetic encoding is selected based on the syntax element being encoded, the syntax being arranged to ensure that the context does not depend on the immediately previously encoded symbol.

4. A method as claimed in claim 1 in which in step b) arithmetic coding is not used for encoding data that are approximately equiprobable.

5. A method as claimed in claim 4 in which data that are approximately equiprobable are encoded using a variable length coding scheme.

6. A method as claimed in claim 1 in which in step b) arithmetic coding is not used for encoding data that have a low probability of occurrence.

7. A method as claimed in claim 6 in which data that have a low probability of occurrence are encoded using a variable length coding scheme.

8. Apparatus for decoding context-based adaptive arithmetic entropy encoded data comprising a first decoder for decoding first encoded data to form first decoded data, an encoder for encoding the first decoded data, the encoder being configured to use a parallel encoding scheme that includes context-based adaptive arithmetic encoding for at least portions of the first decoded data to produce second encoded data, a first in first out, FIFO, memory for storing the second encoded data, and a second decoder for reading the second encoded data from the output of the FIFO memory and decoding the second encoded data to produce the decoded context-based adaptive arithmetic entropy encoded data, wherein the encoder is also configured to encode an N-bit symbol, divide the N-bit symbol into multiple streams and encode at least two of the streams in parallel using a corresponding number of arithmetic encoding units.

9. Apparatus as claimed in claim 8 in which the encoder includes a state machine arranged to interpret a specific syntax to select the context for the arithmetic encoder based on the syntax element being processed, the syntax being chosen to ensure that the context is not dependent on an immediately previous symbol.

10. Apparatus as claimed in claim 9 in which the decoder includes a state machine arranged to interpret a specific syntax to select the context for the arithmetic decoder based on the syntax element being processed, the syntax being chosen to ensure that the context is not dependent on an immediately previously decoded symbol.

11. Apparatus as claimed in claim 8 in which the number of contexts is smaller than the number of contexts used to encode the originally encoded data.

12. Apparatus as claimed in claim 8 comprising a single FIFO memory in which the encoder comprises means for interleaving the encoded data streams before writing it to the FIFO memory and the second decoder comprises means for de-interleaving the data streams read from the FIFO memory.

13. Apparatus as claimed in claim 8 in which the encoder comprises means for encoding portions of the data bits representative of each symbol that are likely to be equiprobable or unlikely to be present using a variable length coding scheme.

14. Apparatus as claimed in claim 8 comprising a plurality of encoders for encoding the first decoded data, means for applying symbols to the encoders in a round robin fashion, and a corresponding plurality of decoders for decoding the second encoded data, each decoder being arranged to produce a decoded symbol in turn.

* * * * *